(12) United States Patent
Bai et al.

(10) Patent No.: US 8,022,615 B2
(45) Date of Patent: Sep. 20, 2011

(54) LIGHT GENERATING LAYER FOR A REFLECTIVE DISPLAY

(75) Inventors: XiaoPing Bai, Lake Zurich, IL (US); Sen Yang, Palatine, IL (US); Wenyong Zhu, Lindenhurst, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 625 days.

(21) Appl. No.: 11/838,227

(22) Filed: Aug. 14, 2007

(65) Prior Publication Data
US 2009/0045722 A1 Feb. 19, 2009

(51) Int. Cl.
*H01J 1/62* (2006.01)
*G02F 1/1335* (2006.01)

(52) U.S. Cl. .................. 313/504; 349/113; 349/63

(58) Field of Classification Search .......... 313/504, 313/113; 349/113, 114, 63
See application file for complete search history.

(56) References Cited

U.S. PATENT DOCUMENTS

| | | | |
|---|---|---|---|
| 5,808,711 A * | 9/1998 | Suppelsa et al. | 349/74 |
| 5,841,496 A * | 11/1998 | Itoh et al. | 349/113 |
| 6,144,165 A * | 11/2000 | Liedenbaum | 315/169.3 |
| 6,753,846 B2 | 6/2004 | Takeuchi et al. | |
| 6,774,964 B2 * | 8/2004 | Funamoto et al. | 349/113 |
| 6,781,647 B2 * | 8/2004 | Fujieda | 349/61 |
| 6,832,840 B2 * | 12/2004 | Masuda | 362/19 |
| 6,842,170 B1 * | 1/2005 | Akins et al. | 345/173 |
| 6,879,354 B1 | 4/2005 | Sawayama et al. | |
| 7,142,179 B2 | 11/2006 | Miller et al. | |
| 7,161,647 B2 * | 1/2007 | Iijima | 349/113 |
| 7,385,654 B2 * | 6/2008 | Mitsui et al. | 349/62 |
| 7,564,186 B2 * | 7/2009 | Song | 313/582 |
| 2002/0080129 A1 * | 6/2002 | Takeuchi et al. | 345/204 |
| 2002/0145687 A1 * | 10/2002 | Mitsui et al. | 349/113 |
| 2003/0218595 A1 * | 11/2003 | Eldon et al. | 345/107 |
| 2006/0072047 A1 * | 4/2006 | Sekiguchi | 349/25 |
| 2006/0132671 A1 * | 6/2006 | Koma | 349/63 |
| 2008/0298084 A1 * | 12/2008 | Yang et al. | 362/607 |
| 2008/0303983 A1 * | 12/2008 | Tanase et al. | 349/69 |
| 2008/0309850 A1 * | 12/2008 | Tanase et al. | 349/69 |

* cited by examiner

*Primary Examiner* — Peter J MacChiarolo
(74) *Attorney, Agent, or Firm* — Cuenot, Forsythe & Kim, LLC; Sylvia Chen

(57) ABSTRACT

A self emission device (644) that emits light (526). The self emission device can include at least one light emission layer (104) encompassing an area, and generating light over such area in a distributed fashion. The self emission device also can include a first electrode (113) interfacing with a first side (116) of the light emission layer and a second electrode (114) interfacing with a second side (117) of the light emission layer. The first electrode and the second electrode can provide energy used by the light emission layer to illuminate. The self emission device can be a component of a display (100) comprising a reflective display panel (102).

15 Claims, 2 Drawing Sheets

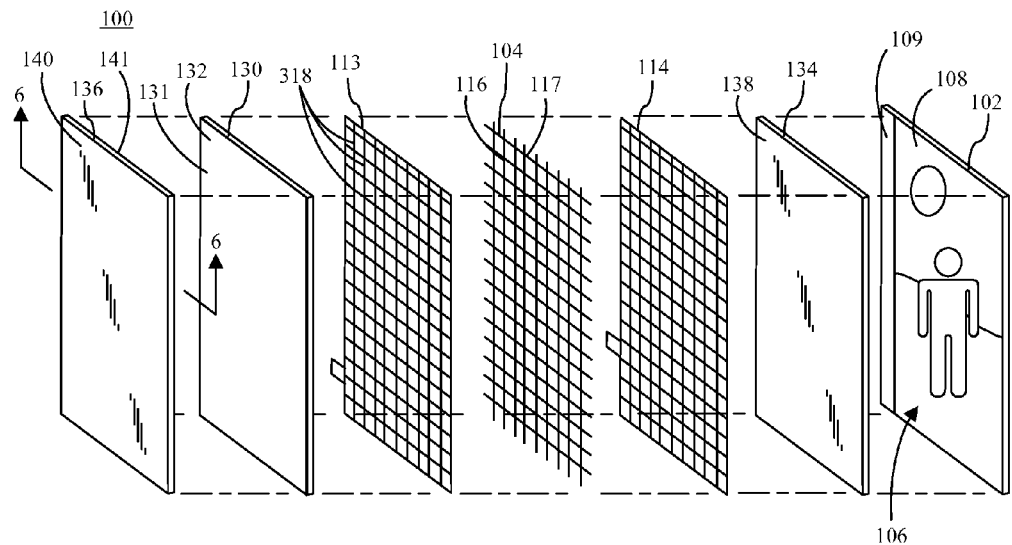
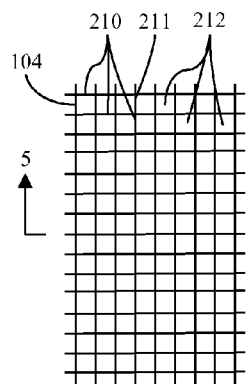
FIG. 2
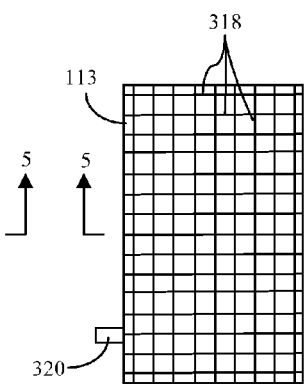
FIG. 3
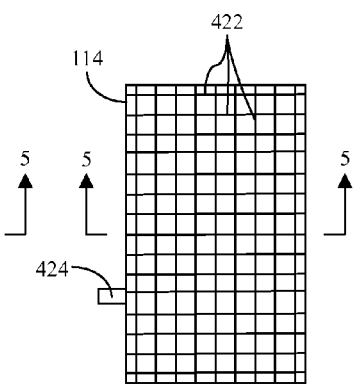
FIG. 4
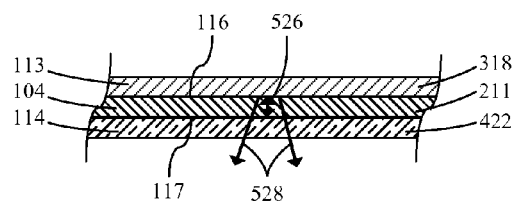
FIG. 5

LIGHT GENERATING LAYER FOR A REFLECTIVE DISPLAY

BACKGROUND OF THE INVENTION

1. Field of the Invention

The present invention generally relates to electronic displays and, more particularly, to reflective displays.

2. Background of the Invention

A reflective display is a display that includes a reflective surface from which visual information is presented. There are a number of reflective display technologies known in the art, examples of which include a reflective liquid crystal display (LCD), an electrophoretic display (EPD), a reflective type thin film transistor display, a flip-dot display, and so on.

Rather than using backlighting for illumination like an emissive electronic display, a reflective display typically relies on ambient light. Thus, a reflective display generally requires less power to operate in comparison to an emissive electronic display. Moreover, a reflective display can be made to be very thin. Indeed, EPDs oftentimes are considered prime examples of the electronic paper category of displays because of their paper-like appearance. Notwithstanding, although reflective displays are typically well suited for use in sunlight or in bright indoor lighting, they typically do not perform well in low-light conditions.

SUMMARY OF THE INVENTION

The present invention relates to a display which includes a reflective display panel on which visual information can be presented. The display also can include at least one light emission layer disposed in front of the reflective display panel. The light emission layer can encompass an area substantially congruent with at least a visible portion of the display panel, and generate light over such area in a distributed fashion.

The display further can include a first electrode interfacing with a first side of the light emission layer and a second electrode interfacing with a second side of the light emission layer. The first electrode and the second electrode can provide energy used by the light emission layer to illuminate.

The light emission layer can be arranged in an illumination pattern. The light emission layer can include at least one component selected from the group consisting of a light emitting diode and an organic light emitting diode. The first electrode can include at least one electrical conductor and can be arranged in the illumination pattern. The first electrode can be positioned to reflect light generated by the light emission layer toward the reflective display panel. In another arrangement, the first electrode can include a transparent conductor. Further, the second electrode can include at least one transparent conductor arranged in the illumination pattern.

The display further can include a light diffusion layer. The light diffusion layer can be disposed in front of the light emission layer.

The present invention also relates to a self emission device that emits light. The self emission device can include at least one light emission layer encompassing an area, and generating light over such area in a distributed fashion. The self emission device also can include a first electrode interfacing with a first side of the light emission layer and a second electrode interfacing with a second side of the light emission layer. The first electrode and the second electrode can provide energy used by the light emission layer to illuminate.

The light emission layer can be arranged in an illumination pattern. The first electrode can include a plurality of electrical conductors arranged in the illumination pattern. The first electrode can be positioned to reflect light generated by the light emission layer toward a particular side of self emission device. In another arrangement, the first electrode can include a transparent conductor. Further, the second electrode can include a transparent conductor arranged in the illumination pattern.

The present invention also relates to a method of manufacturing a self emission device. The method can include depositing a first electrode on a first substrate. The substrate can be transparent or translucent. The method also can include depositing a light emission layer on the first electrode. The light emission layer can encompass an area over which light may be generated in a distributed fashion. Further, a second electrode can be deposited on the light emission layer. The method also can include positioning a second substrate over the second electrode.

BRIEF DESCRIPTION OF THE DRAWINGS

Preferred embodiments of the present invention will be described below in more detail, with reference to the accompanying drawings, in which:

FIG. 1 depicts an exploded view of a display that is useful for understanding the present invention;

FIG. 2 depicts a front view of a light emission layer that is useful for understanding the present invention;

FIG. 3 depicts a front view of a first electrode that is useful for understanding the present invention;

FIG. 4 depicts a front view of a second electrode that is useful for understanding the present invention;

FIG. 5 is an enlarged section view of the light emission layer of FIG. 3 and the electrodes of FIG. 2 and FIG. 4, each taken along section line 5-5, in a stacked configuration;

DETAILED DESCRIPTION

Figure 6:
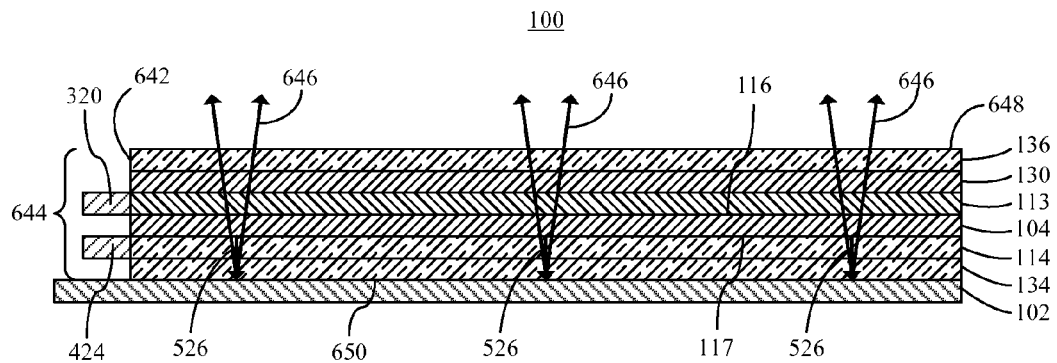
FIG. 6 is an enlarged section view of the display of FIG. 1, taken along section line 6-6, in a stacked configuration.

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

FIG. 1 depicts an exploded view of a display 100 that is useful for understanding the present invention. The display 100 can include a reflective display panel (hereafter "display panel") 102 from which visual information is presented. Such information can include text, graphics, or any other information that may be presented on a display. The display panel 102 can be, for example, a liquid crystal display (LCD) panel, an electrophoretic display (EPD) panel, a reflective type thin film transistor display panel, a flip-dot display panel, or any other suitable reflective display panel.

The display 100 also can include at least one light emission layer 104 that generates and emits light, and is disposed in front of the reflective display panel 102. In one arrangement, the light emission layer 104 can be formed into a desired illumination pattern. Such illumination pattern can encompass an area substantially congruent with at least a visible portion 106 of a front surface 108 of the display panel 102. The illumination pattern need not illuminate portions of the display panel that will not be viewed, for instance a portion 109 upon which display drivers may be mounted, though the invention is not limited in this regard. As used herein, the term "illumination pattern" means a pattern defined by one or more regions from which light is generated.

A front view of the light emission layer 104 is depicted in FIG. 2. The illumination pattern can be defined by regions 210 of the light emission layer 104 that comprise at least one component 211 which generates and emits light, and regions 212 in which the component 211 is absent. The component 211 that generates and emits light can be distributed over the area encompassed by the light emission layer 104. Thus, the light can be generated and emitted in a distributed fashion over such area.

In one arrangement, the component 211 of the light emission layer 104 can comprise one or more light emitting diodes (LEDs). For example, component 211 can comprise a p-type semiconducting material and an n-type semiconducting material which interface to form an emissive electroluminescent layer. Such materials are known to those skilled in the art. In one arrangement, the LED can be organic LED. In an organic LED, the emissive electroluminescent layer may comprise a film of organic compounds. Advantageously, an organic LED can be formed using a low cost inkjet printing process or screen printing. Nonetheless, there are a myriad of materials known to those skilled in the art that can be used to form an emissive electroluminescent layer and the invention is not limited in this regard.

Referring again to FIG. 1, a first electrode 113 and a second electrode 114 can be disposed to contact either of the opposing sides 116, 117 of the light emission layer 104 to supply electrical energy to the light emission layer 104. In an arrangement in which the light emission layer 104 comprises an LED, the polarity of the voltage that is applied can be determined by the orientation of the LED. For example, the electrode 113 can be an anode applying a positive voltage to the LED if p-type semiconducting material is disposed on the first side 116 of the light emission layer 104. In such an arrangement, the electrode 114 can be a cathode applying a negative voltage if n-type semiconducting material is disposed at the second side 117 of the light emission layer 104. Similarly, the electrode 113 can be a cathode applying negative voltage to the LED if n-type semiconducting material is at the first side 116 of the light emission layer 104, and the electrode 114 can be an anode applying a positive voltage to the LED if p-type semiconducting material is disposed at the second side 117 of the light emission layer 104. Of course, if an organic LED is used, the anode and cathode can interface with the suitable layers of organic material. Further, if the light emission layer 104 is non-polarized, the polarity of the electrodes 113, 114 may not be critical so long as sufficient voltage potential is applied across the opposing sides 116, 117 of the light emission layer 104.

FIG. 3 depicts a front view of the first electrode 113. In one arrangement, the electrode 113 can comprise one or more electrical conductors 318 arranged to precisely align with the component(s) 211 of the light emission layer 104. For example, the electrical conductors 318 can be arranged in the same illumination pattern as the light emission layer 104.

If the electrical conductors 318 are opaque, the electrical conductors 318 can be selected so as to have the minimum width required for the electrical current anticipated to be flowing through the electrical conductors 318. Accordingly, the electrical conductors 318 will minimally interfere with the view of the reflective display panel 102.

In another arrangement, the electrical conductors 318 can comprise an electrically conductive material that is transparent (e.g. optically clear). One example of such a material is titanium tin oxide (ITO), although the invention is not limited in this regard and any other suitable conductor that is transparent may be used.

An electrical connector 320 can be electrically connected to the electrode 113 so as to provide the suitable electrical current to the electrode.

FIG. 4 depicts a front view of the second electrode 114. The second electrode 114 can comprise one or more electrical conductors 422 arranged to precisely align with the component(s) 211 of the light emission layer 104. For example, the electrical conductors 422 can be arranged in the same illumination pattern as the light emission layer 104.

In one arrangement, the electrical conductors 422 can comprise an electrically conductive material that is transparent, for instance ITO. Thus, the electrical conductors 422 can minimally affect light radiated by the light emission layer 104 toward the display panel 102.

An electrical connector 424 can be electrically connected to the electrode so as to provide suitable electrical current to the electrode.

FIG. 5 is an enlarged section view of the light emission layer 104 and the first and second electrodes 113, 114, each taken along section line 5-5. Other layers can be stacked with the light emission layer 104 and the electrode 113, 114 to form the display, but such layers are not shown in FIG. 5 for the purpose of clarity. Further, FIG. 5 is not indicative of any specific sequence in which layers of the display should be stacked.

The light emission layer 104 and the first and second electrodes 113, 114 can be stacked such that the electrodes 113, 114 interface with the opposing sides 116, 117 of the light emission layer 104 and component(s) 211, respectively. Light 526 generated by the light emission layer 104 can radiate in multiple directions. In an arrangement in which the electrical conductor 318 is opaque, a portion 528 of such light 526 incident on the electrical conductor 318 can be reflected toward the display panel 102. If the electrical conductor 422 is transparent, the reflected light 528 can pass through the electrical conductor 422 with little or no reflection and/or diffraction.

Referring again to FIG. 1, the display 100 optionally can include a light diffusion layer 130 to diffuse light reflected off of the display panel 102. Such an arrangement can aid in masking the electrical conductors 318 if such conductors are opaque. The light diffusion layer 130 can comprise a light diffusing material 131, for example silicon dioxide, applied a substrate 132. Such substrates are known to the skilled artisan.

The display 100 further can include a first transparent layer 134 and a second transparent layer 136, each of which may comprise a suitable transparent substrate 138, 140, respectively, such as a suitable resin or glass. The transparent layer 134 can be positioned behind the electrode 114, and serve to protect the electrodes 113, 114 and the light emission layer 104. Similarly, the transparent layer 136 can be positioned over the light diffusion layer 130 to provide an outermost surface of the display 100 that serves to protect the display components. In another arrangement, in lieu of using the light diffusion layer 130, the light diffusing material 131 can be applied to the transparent layer 136, for instance to an inner side 141.

FIG. 6 is an enlarged section view of the display 100 of FIG. 1, taken along section line 6-6. The display panel 102, first transparent layer 134, second electrode 114, light emission layer 104, first electrode 113, light diffusion layer 130 and second transparent layer 136 can be arranged in a stack to form the display 100. In particular, the light emission layer 104 can be disposed in front of the display panel 102. Further, the first electrode 113 can be disposed on the first side 116 of the light emission layer 104, opposite the second side 117 facing the display panel 102. The second electrode 114 can be disposed on the second side 117 of the emission layer 104.

Further, the electrical connectors 320, 424 can be disposed such that they are accessible to be connected to a voltage source. For instance, the electrical connectors 320, 424 can extend beyond an edge 642 of the stacked components.

Together, the first transparent layer 134, second electrode 114, light emission layer 104, first electrode 113, light diffusion layer 130 (optional), second transparent layer 136, and electrical connectors 320, 424 can form a self emission device 644. The self emission device 644 can engage, or otherwise be positioned proximate to, the display panel 102.

In operation, voltage can be applied across the connectors 320, 424, thereby applying voltage across light emission layer 104, thereby causing the light emission layer 104 to generate and emit light. In consequence, light 526 can radiate to, and reflect off of, the display panel 102. The reflected light 646 can convey visual information presented on the display panel 102 beyond an upper surface 648 of the self emission device 644. As noted, at least a portion of light 526 propagating directly from the light emission layer 104 to the first electrode 113 can be reflected by the first electrode 113, toward a lower side 650 of the self emission device 644, and onto the display panel 102.

The display 100 can be a component of a telephone, a personal digital assistant, a computer, a television, a video monitor, a stand alone display, a portable device, an appliance, a vehicle, an aircraft, a vessel, equipment, and so on. The invention is not limited to these examples, however, and the display 100 can be a component of any device which having a display.

Figure 7:
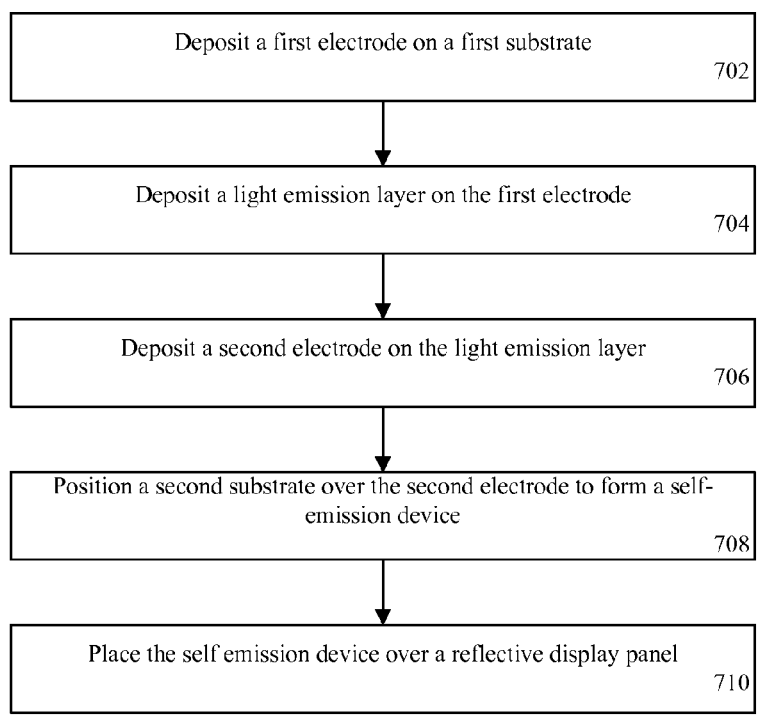
FIG. 7 is a flowchart that is useful for understanding the present invention.

FIG. 7 is a flowchart presenting a method 700 that is useful for understanding the present invention. At step 702 a first electrode can be deposited on a first substrate. The first substrate can be a translucent layer or a transparent layer.

At step 704, a light emission layer can be deposited on the first electrode. For instance, a first semiconductor (e.g. a p-type semiconductor) can be deposited on the first electrode, and a second semiconductor (e.g. an n-type semiconductor) can be deposited on the first semiconductor to form an emissive electroluminescent layer.

At step 706, a second electrode can be deposited on the light emission layer. As noted, the first and second electrodes can be configured to provide electrical energy to the light emission layer.

In one arrangement, deposition of one or more layers can be performed using an inkjet printing process. For example, the layers can be deposited to form a desired illumination pattern. In another arrangement, deposition of one or more layers can be performed using screen printing. Etching techniques also can be implemented. For example, the various layers can be deposited over an entire side of the first substrate in the appropriate order. An etching process then can be implemented to remove portions of such layers where desired to expose the first substrate. The remaining portions of the electrode and light emission layers can form the desired illumination pattern. It should be noted that a myriad of suitable deposition and etching techniques are known to those skilled in the art, and such techniques are within the scope of the present invention.

At step 708, a second substrate can be positioned over the second electrode. The second substrate can be transparent. In an arrangement in which the first substrate is transparent, the first substrate, the first electrode, the light emission layer, the second electrode, and the second substrate together can form a self-emission device. In an arrangement in which the first substrate is translucent, a third substrate can be placed over the first substrate on a side opposite the first electrode. In such an arrangement, the third substrate can be included in the self-emission device. At step 710, the self emission device can be placed over a reflective display panel.

The flowchart and diagrams in the figures illustrate the architecture, functionality, and operation of possible implementations of systems and methods according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language).

This invention can be embodied in other forms without departing from the spirit or essential attributes thereof. Accordingly, reference should be made to the following claims, rather than to the foregoing specification, as indicating the scope of the invention.

What is claimed is:

1. A display device, comprising:
   a reflective display on which visual information is presented;
   at least one light emission layer arranged in an illumination pattern and comprising regions that include at least one component that emits light and regions in which the component that emits light is absent, the light emission layer being disposed in front of the reflective display, the light emission layer encompassing an area congruent with at least a visible portion of the reflective display, and generating light over such area in a distributed fashion;
   a first electrode comprising at least one electrical conductor, the at least one electrical conductor interfacing with a first side of the light emission layer and the at least one electrical conductor being arranged in the illumination pattern;
   a second electrode comprising at least one electrical conductor, the at least one electrical conductor interfacing with a second side of the light emission layer and the at least one electrical conductor being arranged in the illumination pattern; and
   a light diffusion layer disposed in front of the light emission layer,
   wherein the first electrode and the second electrode provide energy used by the light emission layer to illuminate.

2. The display device of claim 1, wherein the light emission layer comprises at least one component selected from the group consisting of a light emitting diode and an organic light emitting diode.

3. The display device of claim 1, wherein the first electrode is positioned to reflect light generated by the light emission layer toward the reflective display.

4. The display of claim 1, wherein the second electrode comprises at least one transparent conductor.

5. The display of claim 1, wherein at least one of the first and second electrodes comprises at least one transparent conductor.

6. A self emission device that emits light, comprising:
   a reflective display on which visual information is presented;
   at least one light emission layer encompassing an area, and generating light over such area in a distributed fashion, the light emission layer comprising regions that include at least one component that emits light and regions in which the component that emits light is absent, the light emission layer being disposed in front of the reflective display, and the light emission layer encompassing an area congruent with at least a visible portion of the reflective display;
   a first electrode interfacing with a first side of the light emission layer;
   a second electrode interfacing with a second side of the light emission layer; and
   a light diffusion layer disposed in front of the light emission layer,
   wherein the first electrode and the second electrode provide energy used by the light emission layer to illuminate.

7. The self emission device of claim 6, wherein the light emission layer is arranged in an illumination pattern.

8. The self emission device of claim 7, wherein the first electrode comprises a plurality of electrical conductors, wherein the plurality of electrical conductors are arranged in the illumination pattern.

9. The self emission device of claim 7, wherein the second electrode comprises at least one transparent conductor, wherein the at least one transparent conductor is arranged in the illumination pattern.

10. The self emission device of claim 8, wherein the first electrode is positioned to reflect light generated by the light emission layer toward a particular side of the self emission device.

11. The self emission device of claim 6, wherein at least one of the first and second electrodes comprises a transparent conductor.

12. A method of manufacturing a self emission device, comprising:
    depositing a first electrode on a first substrate;
    depositing a light emission layer on the first electrode, the light emission layer encompassing an area over which light is to be generated in a distributed fashion, the light emission layer comprising regions that include at least one component that emits light and regions in which the component that emits light is absent, the light emission layer being disposed in front of the reflective display, and the light emission layer encompassing an area congruent with at least a visible portion of the reflective display;
    depositing a second electrode on the light emission layer; and
    positioning a light diffusion layer in front of the second electrode.

13. The method of claim 12, further comprising:
    positioning a second substrate over the light diffusion layer.

14. The method of claim 13, wherein depositing the first electrode on the first substrate comprises depositing the first electrode on a substrate that is transparent.

15. The method of claim 13, wherein depositing the first electrode on the first substrate comprises depositing the first electrode on a substrate that is translucent.

* * * * *